(12) United States Patent
Buurman et al.

(10) Patent No.: US 8,663,881 B2
(45) Date of Patent: Mar. 4, 2014

(54) RADIATION SOURCE, METHOD OF CONTROLLING A RADIATION SOURCE, LITHOGRAPHIC APPARATUS, AND METHOD FOR MANUFACTURING A DEVICE

(75) Inventors: Erik Petrus Buurman, Veldhoven (NL); Szilard Istvan Csiszar, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/554,725

(22) Filed: Jul. 20, 2012

(65) Prior Publication Data

US 2013/0022901 A1    Jan. 24, 2013

Related U.S. Application Data

(60) Provisional application No. 61/510,735, filed on Jul. 22, 2011.

(51) Int. Cl.
*G03C 5/00* (2006.01)

(52) U.S. Cl.
USPC .................. 430/30; 430/945; 355/67; 355/77

(58) Field of Classification Search
USPC .................................. 430/30, 945; 355/67, 77
See application file for complete search history.

(56) References Cited

U.S. PATENT DOCUMENTS

2005/0274897 A1    12/2005    Singer et al.
2011/0063598 A1    3/2011    Fiolka et al.

OTHER PUBLICATIONS

Lin et al., "High power LPP EUV source system development status", SPIE Proceedings vol. 7520, Lithography Asia 2009, Dec. 2009 (SPIE Digital Library reference DOI: 10.1117/12.839488).

*Primary Examiner* — Christopher Young
(74) *Attorney, Agent, or Firm* — Pillsbury Winthrop Shaw Pittman LLP

(57) ABSTRACT

A lithographic apparatus includes an illuminator for receiving a beam of EUV radiation from a radiation source apparatus and for conditioning the beam to illuminate a target area of a patterning device, such as a reticle. The reticle forms a patterned radiation beam. A projection system transfers the pattern from said patterning device to a substrate by EUV lithography. Sensors are provided for detecting a residual asymmetry in the conditioned beam as the beam approaches the reticle, particularly in a non-scanning direction. A feedback control signal is generated to adjust a parameter of said radiation source in response to detected asymmetry. The feedback is based on a ratio of intensities measured by two sensors at opposite ends of an illumination slit, and adjusts the timing of laser pulses generating an EUV-emitting plasma.

12 Claims, 3 Drawing Sheets

RADIATION SOURCE, METHOD OF CONTROLLING A RADIATION SOURCE, LITHOGRAPHIC APPARATUS, AND METHOD FOR MANUFACTURING A DEVICE

CROSS-REFERENCE TO RELATED APPLICATIONS

This application claims the benefit of priority from U.S. Provisional Patent Application No. 61/510,735, filed Jul. 22, 2011, the entire content of which is incorporated herein by reference.

FIELD

The present invention relates to a radiation source, a method of controlling a radiation source, and to lithographic apparatus and a method for manufacturing a device. The invention is particularly applicable to the control of radiation source apparatus for extreme ultraviolet (EUV) radiation.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 μm. It has further been proposed that EUV radiation with a wavelength of less than 10 nm could be used, for example within the range of 5-10 nm such as 6.7 nm or 6.8 nm. Possible sources include laser-produced plasma (LPP) sources, although other types of source are possible.

An example of current progress in the development of LPP sources for EUV lithography is described in the paper "High power LPP EUV source system development status" by Benjamin Szu-Min Lin, David Brandt, Nigel Farrar, SPIE Proceedings Vol. 7520, Lithography Asia 2009, December 2009 (SPIE Digital Library reference DOI: 10.1117/12.839488). In a lithographic apparatus, the source apparatus will typically be contained within its own vacuum housing, while a small exit aperture is provided to couple the EUV radiation beam into an optical system where the radiation is to be used.

In order to be useful in high-resolution patterning for lithography, the EUV radiation beam must be conditioned to obtain desired parameters such as uniformity of intensity and angular distribution, when it reaches the reticle. Examples of an illumination system are described in United States Patent Application Publication Nos. US 2005/0274897A1 (Carl Zeiss/ASML) and US 2011/0063598A1 (Carl Zeiss). The example systems include a 'fly's eye' illuminator which transforms the highly non-uniform intensity profile of the EUV source into a more uniform and controllable source.

For good imaging performance it should also be ensured that the conditioned EUV radiation beam is uniform in intensity, particularly in a non-scanning direction (as explained further below). The known illumination systems include various techniques for uniformity correction, removing residual non-uniformities that are not canceled by the fly's eye illuminator. The known techniques may not be able to correct for all variations in the EUV radiation beam. For example, fluctuations in the position of a fuel droplet relative to the timing and place of a laser pulse may cause asymmetry in the radiation beam that are not canceled by the fly's eye illuminator, but are too rapid to be corrected conveniently by the other uniformity correction mechanisms known to date.

SUMMARY

Aspects of embodiments of the present invention aim to provide novel techniques for maintaining uniformity of a conditioned radiation beam passing though an aperture. Embodiments of the invention aim in particular to detect and correct asymmetries in illumination more rapidly and more directly than known techniques.

According to an aspect of the invention, there is provided a method of controlling a radiation source apparatus in a lithographic system. The method includes providing a radiation source for emitting electromagnetic radiation at an EUV wavelength at a desired location; providing a radiation collector for receiving the emitted radiation and forming a beam of EUV radiation focused at a virtual source point; providing an illumination system for receiving the EUV radiation from said virtual source point and conditioning the beam to provide a desired distribution of EUV radiation over a target area; supporting a patterning device at said target area so as to generate from the conditioned beam a patterned beam of EUV radiation and using the patterned beam of radiation to apply a pattern to a substrate; detecting a residual asymmetry of the EUV radiation in the conditioned beam in the vicinity of said patterning device; and adjusting a parameter of the radiation source in response to the detected residual asymmetry so as to reduce the asymmetry by feedback control.

Because the asymmetry in the beam is detected in the conditioned beam, that is after major non-uniformities have been smoothed, the measurement of residual asymmetry can be much more accurate.

The radiation source in some embodiments includes a fuel supply, a laser energy source, and a controller for synchronizing operation of said laser energy source with operation of said fuel supply so as to transform portions of fuel into a plasma at the desired location. The parameter of the radiation source being adjusted may be, for example, the timing of pulses of laser radiation generated by the laser energy source.

In some embodiments, the residual asymmetry may be detected particularly in a direction transverse to a scanning direction. The target area may be an elongated target area so that a conditioned EUV radiation beam illuminates only a strip of said patterning device at one time. The residual asymmetry may be detected using first and second sensors located at opposite ends of said elongated target area. A ratio of intensities measured by the first and second sensors may be calculated as a measure of said residual asymmetry. Each of these sensors could be implemented as an array of sensor elements in practice.

A uniformity correction may also be applied in conditioning the beam, by physically obscuring portions of the radiation beam in the illumination system prior to the patterning device. In some embodiments of the invention, the uniformity correction may be calculated and applied less frequently than the feedback control mentioned above. Sensors used for measuring the intensity profile may be shared with the function of detecting the residual asymmetry.

An example of an elongated target area where the residual asymmetry of the intensity profile may be detected according to the invention is an illumination slit. A residual asymmetry such as a slit uniformity tilt can for example be optimized using the triggering of a laser energy source. The slit uniformity tilt depends on the exact timing of the laser pulse, including a pre-pulse and/or a main pulse laser. Controlling a delay to the trigger timing gives control over the slit uniformity tilt. This delay can be controlled dynamically, correcting for slit uniformity tilt changes during the exposures of wafers.

According to an aspect of the invention, there is provided a lithographic apparatus for use in performing a method as set forth above. In an embodiment, the apparatus comprises: an illuminator module for receiving a beam of EUV radiation from the radiation source apparatus and for conditioning the beam to illuminate a target area of a patterning device; a support constructed to support a patterning device, the patterning device being capable of imparting the radiation beam with a pattern in its cross-section to form a patterned radiation beam; a substrate table constructed to hold a substrate; and a projection system for producing an image of the illuminated patterning device on a substrate, in order to transfer a pattern from said patterning device to the substrate by EUV lithography, a plurality of sensors for detecting asymmetry in the beam in the vicinity of the patterning device, and an output for providing a feedback control signal to the radiation source in response to detected asymmetry.

According to an aspect of the invention, there is provided a lithographic apparatus that includes a radiation source constructed and arranged to emit electromagnetic radiation at an EUV wavelength from a plasma at a desired location; a radiation collector constructed and arranged to receive EUV radiation and form a beam of EUV radiation focused at a virtual source point; an illumination system constructed and arranged to receive the beam of EUV radiation from the virtual source point and condition the beam of EUV radiation to provide a desired distribution of EUV radiation over a target area; a support constructed to support a patterning device at the target area, the patterning device being configured to impart the beam of EUV radiation with a pattern in its cross-section to form a patterned radiation beam; a substrate table constructed and arranged to hold a substrate; a projection system constructed and arranged to produce an image of the illuminated patterning device on the substrate, in order to transfer a pattern from the patterning device to the substrate by EUV lithography; and a plurality of sensors constructed and arranged to detect residual asymmetry in the beam of EUV radiation in the vicinity of the patterning device, each of the sensors having an output to provide a feedback control signal to the radiation source in response to detected residual asymmetry so that a parameter of the radiation source is adjusted in response to the detected residual asymmetry to reduce the asymmetry by feedback control.

According to an aspect of the invention, there is provided a method of manufacturing a device, for example a semiconductor device, wherein as part of the method, an image of a patterning device is projected using EUV radiation onto a substrate, in order to transfer a device pattern from said patterning device to said substrate. The EUV radiation is provided by a radiation source apparatus controlled by a method as set forth above.

According to an aspect of the invention, there is provided a method of manufacturing a device. The method includes emitting electromagnetic radiation at an EUV wavelength at a desired location with a radiation source; receiving the emitted radiation and forming a beam of EUV radiation focused at a virtual source point with a radiation collector; receiving the EUV radiation from the virtual source point and conditioning the beam with an illuminator to provide a desired distribution of EUV radiation over a target area; supporting a patterning device at the target area to generate from the conditioned beam a patterned beam of EUV radiation; detecting a residual asymmetry of the EUV radiation in the conditioned beam at the patterning device; adjusting a parameter of said radiation source in response to the detected residual asymmetry to reduce the asymmetry by feedback control; and projecting the patterned beam of EUV radiation onto the substrate using the EUV radiation in order to transfer a device pattern from the patterning device to the substrate.

These aspects of the invention and various optional features and implementations thereof will be understood by the skilled reader from the description of examples which follows.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
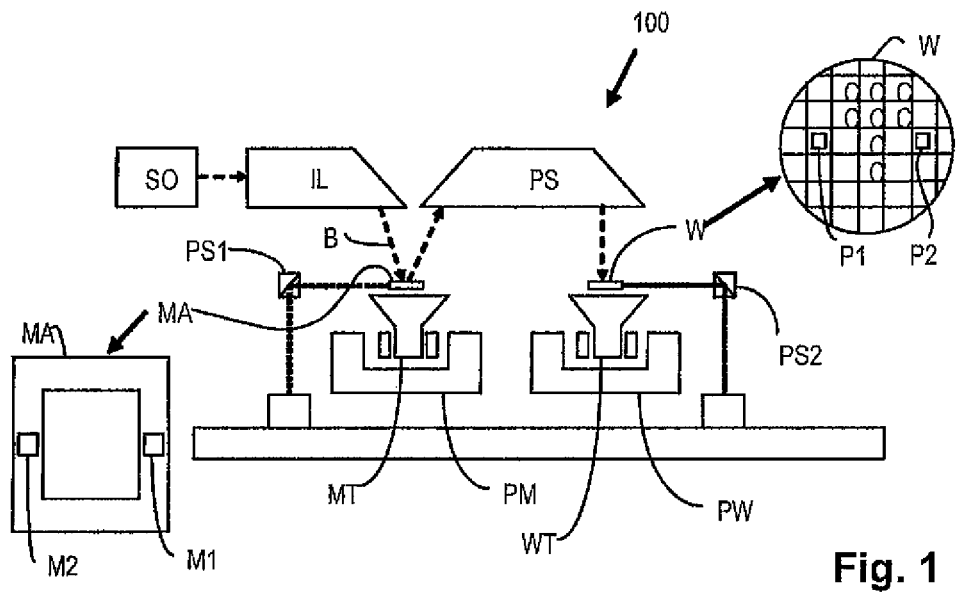
FIG. 1 depicts schematically a lithographic apparatus including an illumination system according to an embodiment of the invention.

FIG. 1 schematically depicts a lithographic apparatus 100 including a source collector module SO which forms a radiation source apparatus according to one embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed. The embodiments to be illustrated involve scanning, as in the modes 2 and 3 just mentioned.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Figure 2:
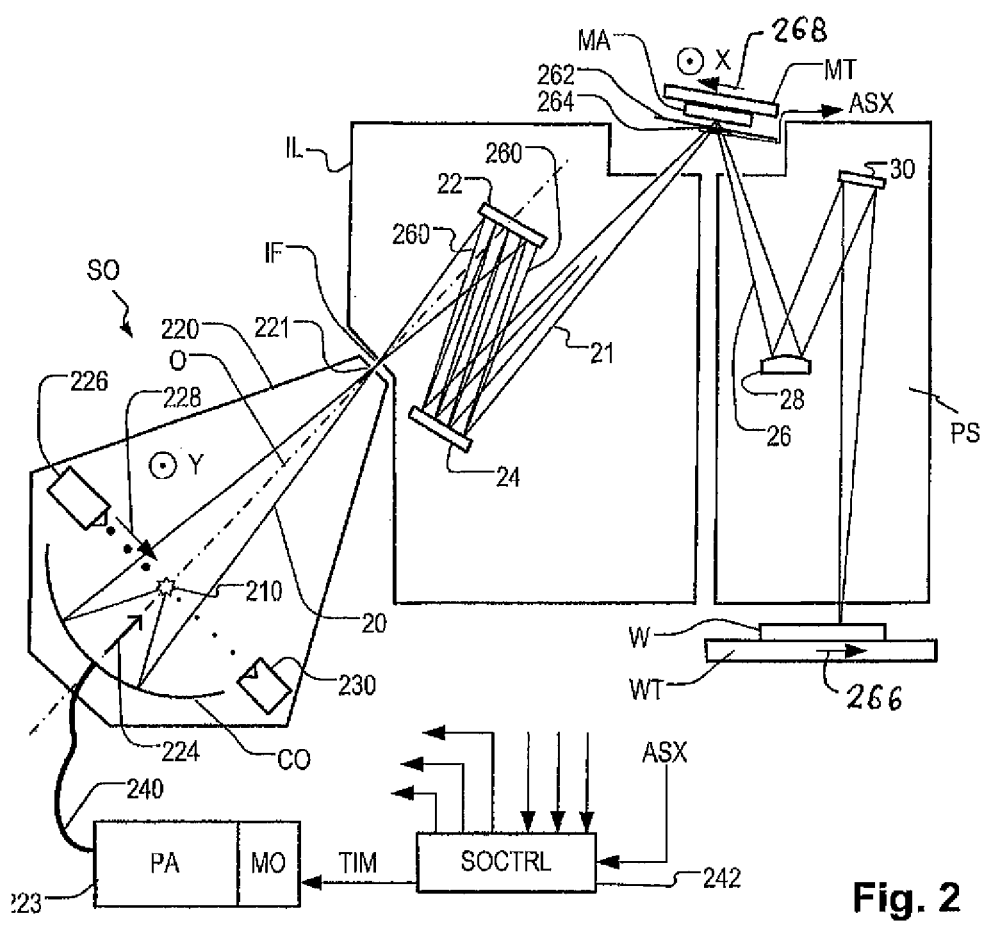
FIG. 2 is a more detailed view of the apparatus of FIG. 1 and shows a novel monitoring and control system for an EUV radiation source.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. The systems IL and PS are likewise contained within vacuum environments of their own. An EUV radiation emitting plasma 210 may be formed by a laser produced LPP plasma source. The function of source collector module SO is to deliver EUV radiation beam 20 from the plasma 210 such that it is focused in a virtual source point. The virtual source point is commonly referred to as the intermediate focus (IF), and the source collector module is arranged such that the intermediate focus IF is located at or near an aperture 221 in the enclosing structure 220. The virtual source point IF is an image of the radiation emitting plasma 210.

From the aperture 221 at the intermediate focus IF, the radiation traverses the illumination system IL, which in this example includes a facetted field mirror device 22 and a facetted pupil mirror device 24. These devices form a so-called "fly's eye" illuminator, which is arranged to provide a desired angular distribution of the radiation beam 21, at the patterning device MA, as well as a desired uniformity of radiation intensity at the patterning device MA. Upon reflection of the beam 21 at the patterning device MA, held by the support structure (mask table) MT, a patterned beam 26 is formed and the patterned beam 26 is imaged by the projection system PS via reflective elements 28, 30 onto a substrate W held by the wafer stage or substrate table WT.

Each system IL and PS is arranged within its own vacuum or near-vacuum environment, defined by enclosing structures similar to enclosing structure 220. More elements than shown may generally be present in illumination system IL and projection system PS. Further, there may be more mirrors present than those shown in the Figures. For example there may be one to six additional reflective elements present in the illumination system IL and/or the projection system PS, besides those shown in FIG. 2. The United States patent application publications referred to above show three additional elements in the illumination system, for example.

Considering source collector module SO in more detail, laser energy source comprising laser 223 is arranged to deposit laser energy 224 into a fuel, such as xenon (Xe), tin (Sn) or lithium (Li), creating the highly ionized plasma 210 with electron temperatures of several 10's of eV. Higher energy EVU radiation may be generated with other fuel materials, for example Tb and Gd. The energetic radiation generated during de-excitation and recombination of these ions is emitted from the plasma, collected by a near-normal incidence collector CO and focused on the aperture 221. The plasma 210 and the aperture 221 are located at first and second focal points of collector CO, respectively.

To deliver the fuel, which for example is liquid tin, a droplet generator 226 is arranged within the enclosure 220, arranged to fire a high frequency stream 228 of droplets towards the desired location of plasma 210. In operation, laser energy 224 is delivered in a synchronism with the operation of droplet generator 226, to deliver impulses of radiation to turn each fuel droplet into a plasma 210. The frequency of delivery of droplets may be several kilohertz, for example 50 kHz. In practice, laser energy 224 is delivered in at least two pulses: a pre pulse with limited energy is delivered to the droplet before it reaches the plasma location, in order to vaporize the fuel material into a small cloud, and then a main pulse of laser energy 224 is delivered to the cloud at the desired location, to generate the plasma 210. A trap 230 is provided on the opposite side of the enclosing structure 220, to capture fuel that is not, for whatever reason, turned into plasma.

Numerous additional components in the source collector module and the lithographic apparatus are present in a typical apparatus, though not illustrated here. These include arrangements for reducing or mitigating the effects of contamination within the enclosed vacuum, for example to prevent deposits of fuel material damaging or impairing the performance of collector CO and other optics. Also, one or more spectral purity filters will be included in the source collector module SO and/or illumination system IL. These filters are for eliminating as much as possible radiation of unwanted wavelengths, which are generated by the laser and/or the plasma 210, in addition to the wanted wavelengths of the UV radiation. The spectral purity filter(s) may be positioned near the virtual source point or at any point between the collector and the virtual source point. The filter can be placed at other locations in the radiation path, for example downstream of the virtual source point IF. Multiple filters can be deployed. The skilled person is familiar with the need for these measures, and the manner in which they may be implemented, and further detail is not required for the purposes of the present disclosure.

Referring to laser 223 from FIG. 2 in more detail, the laser in the presented embodiment is of the MOPA (Master Oscillator Power Amplifier) type. This consists of a "master" laser or "seed" laser, labeled MO in the diagram, followed by a power amplifier (PA). A beam delivery system 240 is provided to deliver the laser energy 224 into the module SO. In practice, the pre-pulse element of the laser energy will be delivered by a separate laser, not shown separately in the diagram. Laser 223, fuel source (i.e. the droplet generator) 226 and other components are controlled by source control module 242. This performs many control functions, and has many sensor inputs and control outputs for various elements of the system, Sensors may be located in and around the elements of source collector module SO, and optionally elsewhere in the lithographic apparatus. As described in more detail below, a particular sensor input ASX in this embodiment represents asymmetry of the illumination intensity at the reticle level, measured in an X direction.

As one of ordinary skill in the art will know, reference axes X, Y and Z may be defined for measuring and describing the geometry and behavior of the apparatus, its various components, and the radiation beams 20, 21, 26. At each part of the apparatus, a local reference frame of X, Y and Z axes may be defined. The Z axis broadly coincides with the direction optical axis O at a given point in the system, and is generally normal to the plane of a patterning device (reticle) MA and normal to the plane of substrate W. In the source collector module, the X axis coincides broadly with the direction of fuel stream (228, described below), while the Y axis is orthogonal to that, pointing out of the page as indicated in FIG. 2. On the other hand, in the vicinity of the support structure MT that holds the reticle MA, the X axis is generally transverse to a scanning direction aligned with the Y axis. For convenience, in this area of the schematic diagram FIG. 2, the X axis points out of the page, again as marked. These designations are conventional in the art and will be adopted herein for convenience. In principle, any reference frame can be chosen to describe the apparatus and its behavior.

Referring in a little more detail to the illumination system, faceted field mirror device 22 comprises an array of individual facets, so that the EUV radiation beam 20 is divided into a number of sub beams, of which one is labeled 260 in the diagram. Each sub beam is directed towards an individual facet on the faceted pupil mirror device 24. The facets of pupil mirror device 24 are arranged to direct their individual sub beams onto a target which is a slit-shaped area of patterning device MA. The division into sub beams 260 and the combination into a single beam 21 is designed to create highly uniform illumination over the slit area, when the illumination arriving from the source collector module is highly non-uniform in its angular distribution. As is also known, the facets of the devices 22 and/or 24 may be steerable and/or maskable, in order to implement different illumination modes.

The conditioned EUV radiation beam 21 is delivered to patterning device MA through a conditioning and masking module 262. This includes the reticle mask (REMA) which may have movable blades defining the extent of the illumination slit in X and Y directions. In front of the REMA may also be an illumination uniformity correction module (UNICOM). Also mounted on or in front of the conditioning module 262 are sensors 264, for measuring the intensity and distribution of the EUV radiation around the slit. Signals from these sensors are used to generate the asymmetry signal ASX which is used, according to an embodiment of the invention, to control the timing of pulses from the laser 223.

To expose a target portion C on substrate W, pulses of radiation are generated on substrate table WT and masked table MT perform synchronized movements 266, 268 to scan the pattern on patterning device MA through the slit of illumination.

Examples of illumination systems including REMA and UNICOM functions are described in United States Patent Application Publication Nos. 2005/0274897A1 and 2011/0063598A1.

Many measures are applied in the source controller 242. Such measures include monitoring to ensure that the virtual source point IF is aligned with the aperture 221, at the exit from the source collector module SO. In systems based on LPP sources, control of alignment is generally achieved by controlling the location of the plasma 210, rather than by moving the collector optic CO. The collector optics, the exit aperture 221 and the illuminator IL are aligned accurately during a set-up process, so that aperture 221 is located at the second focal point of collector optic. However, the exact location of the virtual source point IF formed by the EUV radiation at the exit of the source optics is dependent on the exact location of the plasma 210, relative to the first focal point of the collector optics. To fix this location accurately enough to maintain sufficient alignment generally requires active monitoring and control.

For this purpose, source control module (controller) 242 in this example controls the location of the plasma 210 (the source of the EUV radiation), by controlling the injection of the fuel, and also for example the timing of energizing pulses from laser. In a typical example, energizing pulses of laser radiation 224 are delivered at a rate of 50 kHz (period 20 µs), and in bursts lasting anything from, say, 20 ms to 20 seconds. The duration of each main laser pulse may be around 1 µs, while the resulting EUV radiation pulse may last around 2 µs. By appropriate control, it is maintained that the EUV radiation beam is focused by collector CO precisely on the aperture 221. If this is not achieved, all or part of the beam will impinge upon surrounding material of the enclosing structure.

The source control module 242 is supplied with monitoring data from one or more arrays of sensors (not shown) which provide a first feedback path for information as to the location of the plasma. The sensors may be of various types, for example as described in Unites States Patent Application Publication No. 2005/0274897A1, mentioned above. The sensors may be located at more than one position along the radiation beam path. They may for example be located around and/or behind the field mirror device 22, purely for the sake of example. The sensor signals just described can be used for control of the optical systems of the illuminator IL and projection system PS. They can also be used, via feedback path, to assist the control module 242 of the source collector module SO to adjust the intensity and position of the EUV plasma source 210. The sensor signals can be processed for example to determine the observed location of the virtual source IF, and this is extrapolated to determine, indirectly, the location of the EUV source. If the virtual source location drifts, as indicated by the sensor signals, corrections are applied by control module 242 to re-center the beam in the aperture 221.

Rather than rely entirely on the signals from the illuminator sensors, additional sensors and feedback paths may generally be provided in the source collector module SO itself, to provide for more rapid, direct and/or self-contained control of the radiation source. Such sensors may include one or more cameras, for example, monitoring the location of the plasma. In this way the location beam 20 is maintained in the aperture 221, and damage to the equipment is avoided, and efficient use of the radiation is maintained.

In addition to monitoring the position of the plasma, sensors at the illumination system and sensors 264 at the reticle level monitor the intensity of the EUV radiation, and provide feedback to control module 242. Intensity can be controlled for example by modifying the quantity of fuel delivered in the stream 228, particularly by adjusting the energy of the laser pulses.

In addition to ensuring that the virtual source point IF is correctly located, and its overall intensity are as desired, the problem of uniformity of illumination across illumination slit at the reticle level should be addressed. Signals from sensors 264 are therefore used to control the UNICOM module to trim the illumination slit, so as to compensate for non-uniformities in illumination. Of course, it would be desirable to minimize the non-uniformities rather than mask them with the UNICOM. In addition, the UNICOM is not designed for correcting high frequency variations in the uniformity, and is typically updated only between exposures or even between substrates. Camera modules included in the source enclosure 220 are more directly concerned with centering the plasma so that the distribution of illumination at the slit should be uniform. However, these also are limited in their speed of response, due to the delays of image processing. They may also be able to detect the position of the plasma, but not asymmetry of the generated EUV radiation beam. Accordingly, a novel apparatus including the feedback of the asymmetry signal ASX from sensors 264 at reticle level has been devised to provide another source of control information, as will now be described in more detail.

In describing the sensors 264 as being "at reticle level", or "in the vicinity of the patterning device", no fixed threshold of proximity to the patterning device is intended. However, the purpose of the sensors is to detect residual asymmetry that has not and will not be corrected in the beam conditioning optics of the illumination module IL. They will do this most accurately when they are as close to the reticle MA as possible. The sensors may be located between the UNICOM and the patterning device. In principle, the sensors could be arranged to detect radiation reflected by peripheral portions of the patterning device. This latter option would require modification of the patterning device and REMA to ensure (a) that suitable reflective portions are present for the residual asymmetry detection and (b) that those reflective portions do not contribute to the image projected on substrate W.

Figure 3:
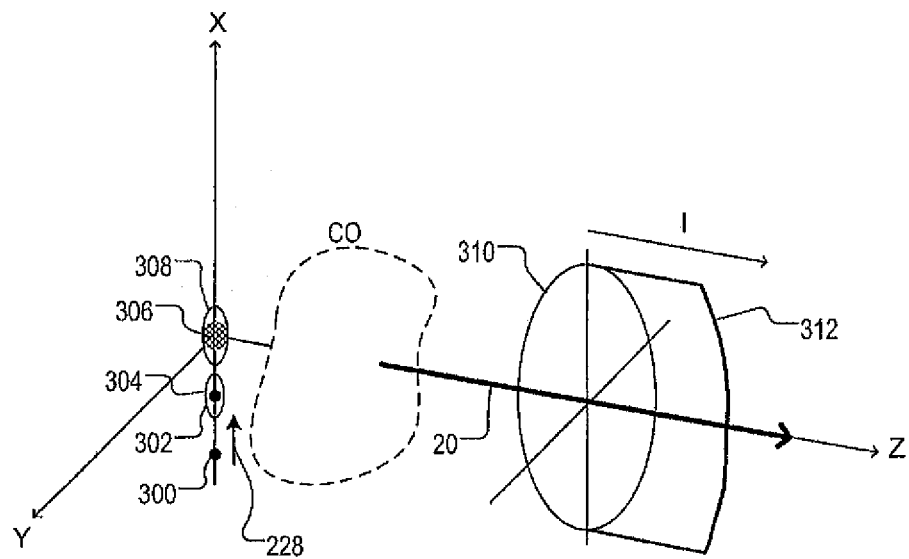
FIG. 3 illustrates schematically the process of generating an EUV radiation beam in the apparatus of FIG. 2, where an intensity profile of the beam is symmetric.

FIG. 3 illustrates schematically the process of generating the EUV-emitting plasma, and a resulting intensity distribution in the beam 20 axes X, Y and Z are defined, with the Z axis corresponding to the optical axis O of source collector module SO. By convention, the X axis is aligned with the stream 228 of fuel droplets, with the droplets travelling in the positive X direction, as shown. The Y axis is perpendicular to the X and Z directions. The origin where the X, Y and Z axes intersect is located at the focal point of collector CO. As we know from the preceding description, this is the ideal location for the plasma 210. Reference number 310 represents the cross section of the EUV radiation beam 20, at some distance from elector optic. The location may be in a plane in front of or behind the virtual source point IF, and we shall assume that it is located in the illumination module (behind IF), for example in the plane of the field mirror device 22. Between the plasma location and the cross section 310, the collector optics CO focus and reverse the direction of the beam towards the aperture 221. The beam may be inverted, magnified, etc., according to the geometry of the optical system, and according to the location of the plane in which cross section 310 is located. All these details are not essential to an understanding of the present invention, and the collector optics, folding, magnification, etc., will not be represented further in FIG. 3 or the drawings that follow.

To generate the plasma 210 at the desired location, laser pulses are fired as follows. The stream of fuel droplets 228 arrives at the origin along the X axis, from the negative X direction. The first droplet is shown at 300. A second droplet 302, launched slightly earlier, is at the location where it will be impinged by the pre pulse 304 of laser radiation 224. The energy of this pre pulse is sufficient to vaporize the fuel contained in the droplet, so that it forms a cloud of fuel material which continues travelling towards the origin. Reference number 306 represents such a cloud located perfectly at the origin, where it is impinged by the main laser radiation pulse 308 and forms the plasma 210 shown in FIG. 2. In relation to the cross section 310, curve 312 represents an intensity profile of the EUV radiation across the beam 20. In a desired situation, profile 312, while not necessarily uniform, is at least symmetrical in X and Y directions, about the Z axis.

Figure 4:
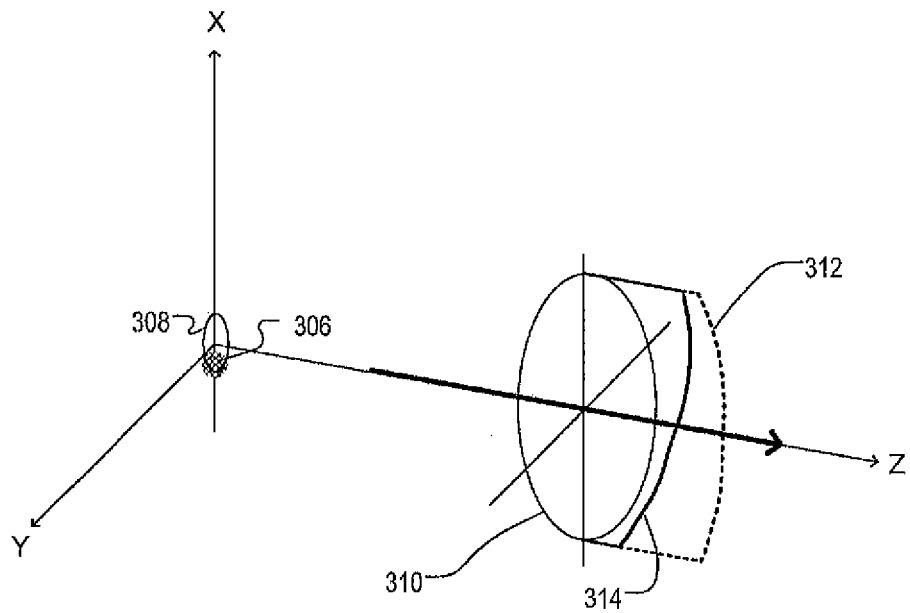
FIG. 4 illustrates schematically generating an EUV radiation beam with an asymmetric intensity profile caused by incorrect laser timing.

FIG. 4 illustrates the non ideal situation, in which the radiation pulse 308 is delivered when the fuel cloud 306 is not quite at the ideal location. In the example of FIG. 4, the laser has fired slightly too early, so that the cloud 306 is still slightly below the origin (negative X direction). Alternatively, the laser may fire slightly too late, so that the cloud has passed the ideal location (positive X direction). Further situations are possible, in which the droplet stream, and hence the cloud 306 is displaced from the X axis by an error in the Y direction, and errors in the X and Y direction can become combined in a real situation. Looking at the consequences of mistiming the laser pulse, FIG. 4 shows that the symmetrical intensity profile 312 is no longer achieved in the beam cross section 310 rather, an asymmetrical intensity profile 314 is achieved. The exact form of the intensity profile will depend on many factors, as will the orientation of the asymmetry. In addition to the exact location of plasma 210 being dictated by the exact location of cloud 306 during the laser ignition and the lifetime of the plasma, more complex effects may also affect the intensity and symmetry of the intensity profile 314. For example, where the location of the cloud 306 is such that part of it is outside the laser beam, a part-shell of the cloud will not be made into plasma. Not only will the total amount of plasma, and hence EUV radiation, be reduced, but the non-plasma portion of the cloud may act as an absorber of the EUV radiation generated in the plasma, casting a shadow in a certain direction. This and other effects could lead to a variety of distortions in the intensity profile 314.

Figure 5:
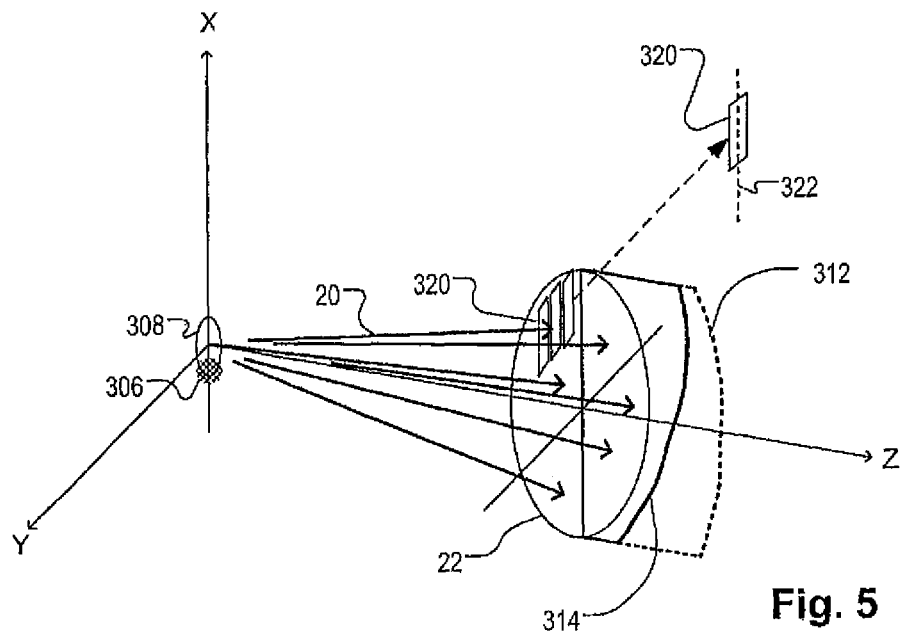
FIG. 5 illustrates schematically the asymmetric radiation beam impinging on a facetted field mirror device of the illumination system in the lithographic apparatus of FIG. 2.

FIG. 5 illustrates the impingement of beam 20 on the plane of the field mirror device 22 in the apparatus for FIG. 2. Beam 20 includes rays travelling in all directions. Field mirror device 22, as mentioned above, comprises a number of individual facets 320, of which a few are shown in FIG. 5. Each facet 320 has an elongate form, and will be imaged by a respective facet of pupil mirror device 24 on to the elongate illumination slit at the level of patterning device MA. The longitudinal axis of 322 of the facet 320 is aligned with the X axis of the instrument. At reticle level, this axis is transverse to a scanning direction, which consequently is aligned with the Y axis. One of ordinary skill in the art will understand that the X, Y and Z axes are geometrically transformed through the optical system, rather than being fixed in space. In other words, the X, Y and Z axes at the location of the plasma are related to, but not the same as X, Y and Z axes at the patterning device and mask support MT, which in turn are related to but not the same as X, Y and Z axes at the location of the substrate W and substrate table WT. One of ordinary skill in the art will also appreciate that, in practice, facets 320 and the illumination slit itself are not straight rectangles as shown, but rather curved into a "banana" shape. This banana shape is omitted from the present disclosure for the sake of simplicity.

Figure 6:
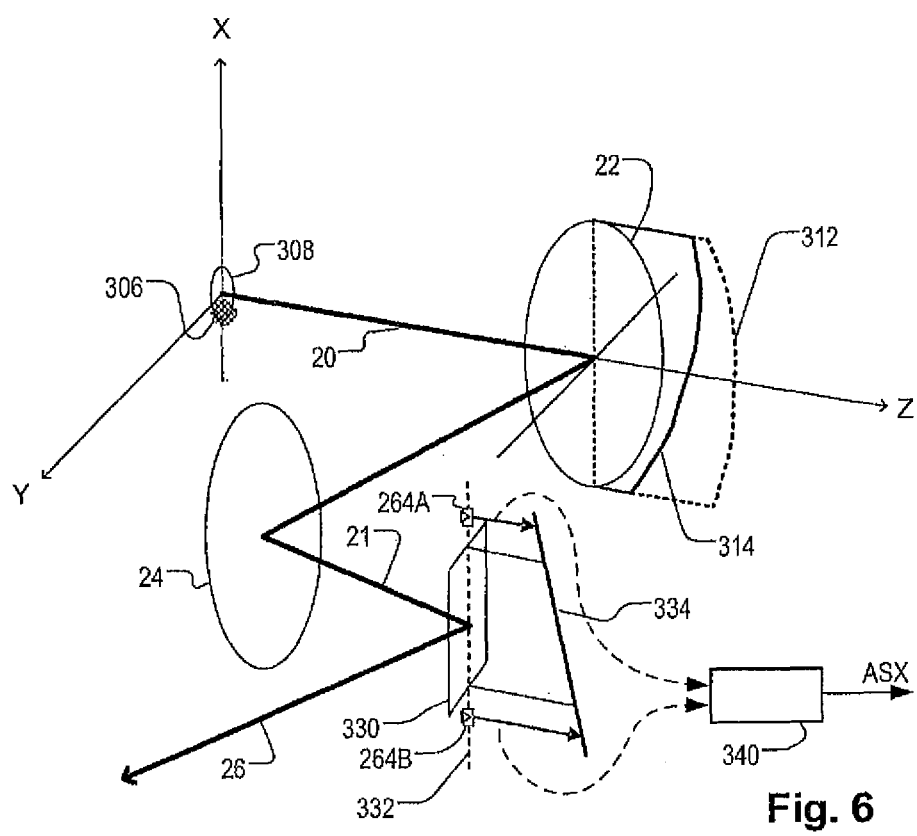
FIG. 6 illustrates schematically the detection of asymmetry in a conditioned radiation beam delivered by the illumination system of FIG. 2.

FIG. 6 illustrates the same situation as FIG. 5, but showing the progress of the radiation beam from field mirror device 22, via pupil mirror device 24 to the illumination slit 330 located just in front of the patterning device MA. As just described, illumination slit 330 is shown as an elongated rectangle, though in practice it is banana-shaped. The longitudinal axis 332 corresponds with an X axis of the mask table MT, which is transverse to a scanning (Y) direction. Because of the incorrect timing of the laser pulse 308 compared to the location of fuel cloud 306, the highly non-symmetrical intensity profile 314 exists at the location of the field mirror device 22, rather than the ideal, symmetrical profile 312. By the operation of the faceted mirror devices 22 and 24, the conditioned beam 21 has a far better uniformity than the unconditioned beam 20 received from the plasma (via collector optic CO and intermediate focus IF) nevertheless, because the general asymmetry is represented across all the individual facets 320 of the field mirror device 22, the intensity profile 314 in the plane of the illumination slit 330 still exhibits a certain residual asymmetry (exaggerated in the drawing). While asymmetries of the profile in the Y direction will be averaged out by the scanning movement of the illumination slit over the patterning device and substrate, asymmetries in the X direction (longitudinal direction of the slit) will not. Consequently, if the asymmetry in the profile 334 is not corrected, it will cause a corresponding variation in the dose received by the radiation-sensitive resist at different locations across the target portion C of substrate W (FIG. 1). For good imaging of very fine patterns on substrate W, such non-uniformity of the radiation dose cannot be tolerated.

As mentioned already, intensity sensors 264 are located around the illumination slit to measure the intensity at various points.

In known apparatus, measurements via sensors 264 distributed around the slit 330, are used for example to monitor the intensity of the source. Feedback may be provided to control the source power if desired. Further, individual sensors along the length of the slit are provided and used to detect non-uniformity along the slit, and to apply corrections via the uniformity correction module (UNICOM), mentioned above. Provided the asymmetry illustrated in profile 314 remains constant throughout an exposure, the UNICOM (not shown) may be sufficient to achieve the desired uniform dose across each target portion C on substrate W. On the other hand, if the position of the fuel cloud 306 at the moment of the laser pulse 308 varies on a timescale of fractions of a second, for example, the UNICOM mechanism is not well-suited to maintaining uniformity.

Consequently, it is proposed herein to use two or more of these sensors 264 to detect asymmetry in the illumination at the patterning device, and to provide a signal ASX as feedback to the source controller 242. The controller in turn can use the magnitude and sign of the asymmetry signal to advance or retard the laser pulses to optimize the symmetry of the plasma 210. In principle, the stream of fuel droplets could be advanced or retarded, and/or the direction of the laser beam 224 could be tilted in X and/or Y directions. However, control of the laser pulse timing, particularly in the example of a MOPA laser, is relatively simple and allows feedback control to correct variations in residual asymmetry relatively quickly.

To describe this new feedback mechanism in more detail, FIG. 6 shows schematically two particular sensors 264A and 264B, positioned at the extreme ends of the slit 330. These sensors measure points on the intensity profile 314 illustrated by the arrows in FIG. 6. A comparison module 340 compares the signals from the sensors 264A and 264B at opposite ends of the illumination slit 330, to derive an asymmetry signal ASX, which is then fed to the source control module 242 to influence the timing of the laser pulses generated by laser 223. The comparison in one embodiment is made in terms of ratios of the signals from the sensors 264A and 264B, rather than absolute difference.

While two point-like sensors 264A and 264B are illustrated for the sake of simplicity, multiple sensors, sensors extended over a wider area and other variations and combinations are all possible, within the knowledge of the skilled reader. The asymmetry signal could be derived by averaging values measured along the edges of the slit, rather than by sensors only at the ends, if desired. The unit 340 may be a dedicated hardware unit, or it may be implemented for example as part of the software controlling the illumination system, the source collector module SO.

Using MOPA laser of the type illustrated as the laser radiation source, the timing of the powerful laser pulse 308 can be very well controlled by controlling the timing of the lower power master oscillator pulse that is fed to the optical power amplifier PA. Other types of laser can be used as an alternative. The choice of laser type should be made according to whether the feedback to correct asymmetry is to be implemented by varying the laser pulse timing or by other means. The timing of the pre-pulse 304 may also be adjusted, as necessary. The feedback loop represented by the asymmetry signal ASX controlling the timing of the laser pulse should be integrated with the other control mechanisms and feedback loops that may influence the timing of the pulse in relation to the location of the fuel droplets. As the skilled person will readily appreciate, the frequency response and gain of each feedback loop should be designed with regard to the other, and with regard to characteristics of the system being controlled, so that they do not conflict or cause instability in operation. As mentioned already, it is expected that the asymmetry feedback via signal ASX from the location of the illumination slit 330 may be relatively fast-responding, while feedback through cameras and other sensors in the source collector module CO may act with a longer timescale. A systematic drift or step-change in the profile as detected by the sensors 264 may, over time, be adjusted back to zero by the action of those other feedback mechanisms, such as the UNICOM mentioned already.

While the examples and explanations given with regard to FIGS. 3 to 6 concern mainly the consequences of mistiming the laser in relation to the X position of the droplet, misalignment of the droplet stream in the Y direction can also cause asymmetry of the intensity profile in the X direction. The effects of these may of course be combined in a real situation. The mechanisms described herein are for correction of the laser pulse timing, and consequently the X position of the droplet stream only. Other measures can be taken, as desired, in order to correct for deviations in the Y position of the droplet at the time of laser ignition. While the UNICOM functions described are located at the reticle level, corrections can be made alternatively or additionally by obscuring or diverting parts of the EUV radiation beam at points further upstream in the illumination system optics, for example as described in United States Patent Application Publication No, 2011/0063598A, mentioned above.

While specific embodiments of the invention have been described above, it will be appreciated that the invention may be practiced otherwise than as described. The behavior of the apparatus may be defined in large part by a computer program containing one or more sequences of machine-readable instructions for implementing certain steps of a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

What is claimed is:

1. A method of controlling a radiation source apparatus in a lithographic system, the method comprising:
   providing a radiation source for emitting electromagnetic radiation at an EUV wavelength at a desired location;
   providing a radiation collector for receiving the emitted radiation and forming a beam of EUV radiation focused at a virtual source point;
   providing an illumination system for receiving the EUV radiation from said virtual source point and conditioning the beam to provide a desired distribution of EUV radiation over a target area;
   supporting a patterning device at said target area so as to generate from the conditioned beam a patterned beam of EUV radiation and using said patterned beam of radiation to apply a pattern to a substrate;
   detecting a residual asymmetry of the EUV radiation in said conditioned beam at said patterning device; and
   adjusting a parameter of said radiation source in response to the detected residual asymmetry so as to reduce the asymmetry by feedback control.

2. A method as claimed in claim 1, wherein the radiation source includes a fuel supply, a laser energy source, and a controller for synchronizing operation of the laser energy source with operation of the fuel supply so as to transform portions of fuel into a plasma at the desired location, and wherein said adjusting the parameter comprises timing of pulses of laser radiation generated by the laser energy source.

3. A method as claimed in claim 2, wherein the laser energy source is delivered in at least two pulses, including a pre pulse delivered to portions of the fuel before the fuel reaches the plasma location in order to vaporize the fuel material into a cloud, and a main pulse of laser energy delivered to the cloud at the desired location to generate the plasma.

4. A method according to claim 3, wherein the laser energy source delivering the main pulse of laser energy to generate the plasma is a Master Oscillator Power Amplifier (MOPA) type laser.

5. A method as claimed in claim 1, wherein the target area is elongated so that the conditioned beam illuminates only a strip of the patterning device at one time, wherein the patterning device is scanned across the target area in a scanning direction to illuminate a complete product pattern over time.

6. A method as claimed in claim 5, wherein the residual asymmetry is detected particularly in a direction transverse to the scanning direction.

7. A method as claimed in claim 1, wherein two or more sensors are used to detect asymmetry in the illumination at the elongated target area and to provide a signal as feedback to the source controller.

8. A method as claimed in claim 7, wherein the source controller uses the magnitude and sign of asymmetry signal to advance or retard a stream of fuel droplets and/or the direction of the laser beam direction tilted as to optimize the symmetry of the plasma.

9. A method as claimed in claim 6, wherein the residual asymmetry is detected using first and second sensors located at opposite ends of said elongated target area, and a ratio of intensities measured by the first and second sensors is calculated as a measure of the residual asymmetry.

10. A method as claimed in claim 5, further comprising measuring an intensity profile along the length of the target area using sensors in the vicinity of said patterning device, and calculating and applying a uniformity correction by physically obscuring portions of the radiation beam in the illumination system prior to the patterning device, wherein the uniformity correction is calculated and applied less frequently than the feedback control.

11. A method as claimed in claim 5, wherein the elongated target area is an illumination slit and the residual asymmetry is a slit uniformity tilt.

12. A method of manufacturing a device, the method comprising:
    emitting electromagnetic radiation at an EUV wavelength at a desired location with a radiation source;
    receiving the emitted radiation and forming a beam of EUV radiation focused at a virtual source point with a radiation collector;
    receiving the EUV radiation from the virtual source point and conditioning the beam with an illuminator to provide a desired distribution of EUV radiation over a target area;
    supporting a patterning device at the target area to generate from the conditioned beam a patterned beam of EUV radiation;
    detecting a residual asymmetry of the EUV radiation in the conditioned beam at the patterning device;
    adjusting a parameter of said radiation source in response to the detected residual asymmetry to reduce the asymmetry by feedback control; and
    projecting the patterned beam of EUV radiation onto the substrate using the EUV radiation in order to transfer a device pattern from the patterning device to the substrate.

* * * * *